United States Patent
Yuan

(10) Patent No.: US 10,461,279 B2
(45) Date of Patent: Oct. 29, 2019

(54) TOP-OLEDS WITH MULTILAYER OUTPUT COUPLING UNIT AND FLAT PANEL DISPLAY DEVICES USING THE SAME

(71) Applicant: Shenzhen China Star Optoelectronics Technology Co., Ltd., Shenzhen, Guangdong (CN)

(72) Inventor: Wei Yuan, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 103 days.

(21) Appl. No.: 15/543,992

(22) PCT Filed: Jun. 23, 2017

(86) PCT No.: PCT/CN2017/089675
§ 371 (c)(1),
(2) Date: Jul. 15, 2017

(87) PCT Pub. No.: WO2018/218715
PCT Pub. Date: Dec. 6, 2018

(65) Prior Publication Data
US 2018/0351132 A1 Dec. 6, 2018

(30) Foreign Application Priority Data
Jun. 1, 2017 (CN) .......................... 2017 1 0405437

(51) Int. Cl.
*H01L 51/52* (2006.01)
*H01L 27/32* (2006.01)

(52) U.S. Cl.
CPC .......... *H01L 51/5275* (2013.01); *H01L 27/32* (2013.01); *H01L 2251/5315* (2013.01)

(58) Field of Classification Search
CPC ................. H01L 51/5275; H01L 27/32; H01L 2251/5315
See application file for complete search history.

(56) References Cited

U.S. PATENT DOCUMENTS 9,829,710 B1 * 11/2017 Newell .............. G02B 27/0172
2005/0052130 A1 3/2005 Wei et al.
(Continued)

FOREIGN PATENT DOCUMENTS

| CN | 103633256 A | 3/2014 |
| CN | 105720208 A | 6/2016 |

*Primary Examiner* — Peter Bradford
(74) *Attorney, Agent, or Firm* — Andrew C. Cheng

(57) ABSTRACT

The present disclosure relates to a flat panel display device and a top organic light emitting diode (Top-OLED). The Top-OLED includes: a light emitting unit and a light output coupling unit configured on a light output surface of the light emitting unit, wherein the light output coupling unit is configured with a first light emitting coupling layer and a second first light emitting coupling layer configured on the light output surface of the light emitting unit in sequence A refractive index of the first light emitting coupling layer is greater than a refractive index of the second light emitting coupling layer. The light emitting coupling layers configured on the light output surface of the light emitting unit having the refractive index being configured to be decreased gradually, so as to enhance the external quantum efficiency and to increase the amount of outputting light beams.

8 Claims, 4 Drawing Sheets

(56) References Cited

U.S. PATENT DOCUMENTS

| | | | |
|---|---|---|---|
| 2010/0052522 A1* | 3/2010 | Kim | H01L 51/5048 |
| | | | 313/504 |
| 2011/0260148 A1 | 10/2011 | Lee et al. | |
| 2016/0329383 A1* | 11/2016 | Li | H01L 51/5218 |
| 2017/0309861 A1* | 10/2017 | Wang | H01L 51/5275 |
| 2018/0351132 A1* | 12/2018 | Yuan | H01L 51/5275 |
| 2019/0074457 A1* | 3/2019 | Choi | C07F 15/0086 |

* cited by examiner

TOP-OLEDS WITH MULTILAYER OUTPUT COUPLING UNIT AND FLAT PANEL DISPLAY DEVICES USING THE SAME

BACKGROUND

1. Technical Field

The present disclosure relates to display field, and particularly to a flat panel display device and a Top-OLED thereof.

2. Description of Related Art

Organic light emitting diode (OLED) is widely adopted in the flat panel display (FDP) field. The OLED has great attributes when being compared with the conventional liquid crystal display (LCD). With the evolution of the phosphorescent material, the internal quantum efficiency of the OLED device may reach 100 percent. However, the external quantum efficiency may only be in a range from 20 to 50 percent due to the structure and the material of the OLED device. Most of the photons are absorbed and full-reflected within the OLED device by the material, which may reduce the performance of the OLED device and reduce the life cycle of the organic material. Conventionally, the microcavity structure, the dielectric layer, or changing the surface structure may be adopted to improve the light emitting coupling efficiency of the OLED.

Adopting the micro-cavity structure may enhance the external quantum efficiency by 1.6 times when being compared with the conventional OLED device. The dielectric layer may adopt the scattering layer to enhance the refractive index by 40 percent when being compared with the conventional OLED device. The micro-lens array may be arranged on the back of indium tin oxide (ITO) glass substrate, and the light emitting coupling efficiency may be enhanced by 50 percent when being compared with the conventional OLED device.

However, the micro-cavity structure may narrow the viewing angle of the OLED device. The surface flatness of the dielectric layer is poor due to the nanoparticles, which may result in a non-uniform distribution of the reflection light and may narrow the viewing angle. The manufacturing process of the micro-lens array is complicated and may lead to high costs.

SUMMARY

The present disclosure relates to a flat panel display device and a Top-OLED.

In one aspect, a Top-OLED, including: a light emitting unit; a light output coupling unit configured on a light output surface of the light emitting unit, wherein the light output coupling unit is configured with a first light emitting coupling layer and a second first light emitting coupling layer configured on the light output surface of the light emitting unit in sequence, and a refractive index of the first light emitting coupling layer is greater than a refractive index of the second light emitting coupling layer; the light output coupling unit further includes a third light emitting coupling layer configured on the second first light emitting coupling layer, wherein the refractive index of the second light emitting coupling layer is greater than a refractive index of the third light emitting coupling layer; wherein the first light emitting coupling layer is made of organic material or inorganic material having the refractive index greater than 1.75.

In another aspect, a Top-OLED, including: a light emitting unit; a light output coupling unit configured on a light output surface of the light emitting unit, wherein the light output coupling unit is configured with a first light emitting coupling layer and a second first light emitting coupling layer configured on the light output surface of the light emitting unit in sequence, and a refractive index of the first light emitting coupling layer is greater than a refractive index of the second light emitting coupling layer.

In another aspect, a flat panel display device, including a Top-OLED, wherein the Top-OLED includes: a light emitting unit; a light output coupling unit configured on a light output surface of the light emitting unit, wherein the light output coupling unit is configured with a first light emitting coupling layer and a second first light emitting coupling layer configured on the light output surface of the light emitting unit in sequence, and a refractive index of the first light emitting coupling layer is greater than a refractive index of the second light emitting coupling layer.

In view of the above, the present disclosure provides the flat panel display device and the Top-OLED, wherein the light emitting coupling layers configured on the light output surface of the light emitting unit having the refractive index being configured to be decreased gradually, so as to enhance the external quantum efficiency and to increase the amount of outputting light beams.

DETAILED DESCRIPTION

To clarify the purpose, technical solutions, and the advantages of the disclosure, embodiments of the invention will now be described more fully hereinafter with reference to the accompanying drawings, in which embodiments of the invention are shown. The figure and the embodiment described according to figure are only for illustration, and the present disclosure is not limited to these embodiments.

Figure 1:
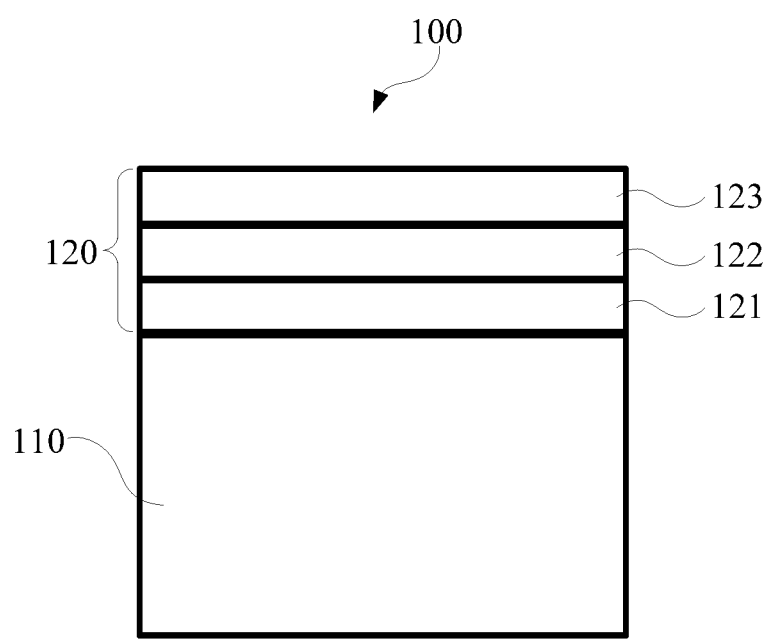
FIG. 1 is a schematic view of a Top-OLED in one embodiment of the present disclosure.

Referring to FIG. 1, the present disclosure relates to a top organic light emitting diode (Top-OLED) 100. The Top-OLED 100 includes a light emitting unit 110 and a light output coupling unit 120 configured on a light output surface of the light emitting unit 110. Wherein the light output coupling unit 120 is configured with a first light emitting coupling layer 121 and a second first light emitting coupling layer 122 configured on the light output surface of the light emitting unit 110 in sequence. A refractive index of the first light emitting coupling layer 121 is greater than a refractive index of the second light emitting coupling layer 122.

In one example, the light output coupling unit 120 may further include a third light emitting coupling layer 123 configured on the second first light emitting coupling layer 122, wherein the refractive index of the second light emitting coupling layer 122 is greater than a refractive index of the third light emitting coupling layer 123.

In one example, the first light emitting coupling layer 121 is made of organic material or inorganic material having the refractive index greater than 1.75. Specifically, the first light emitting coupling layer 121 may be made of NPB (refractive index equals to 1.81 when the wavelength equals to 520 nm), ZnS (refractive index equals to 2.4 when the wavelength equals to 550 nm), ZnSe (refractive index equals to 2.58 when the wavelength equals to 550 nm), ITO, or IZO.

In one example, the second light emitting coupling layer 122 may be made of organic material, inorganic material, or composite material having the refractive index in a range from 1.4 to 1.75. Specifically, the inorganic material may adopt LaF3 (refractive index equals to 1.58 with wavelength equals to 550 nm), YF3 (refractive index equals to 1.55 with wavelength equals to 550 nm), or CeF3 (refractive index equals to 1.63 with wavelength equals to 500 nm). The organic material may adopt TcTa (refractive index equals to 1.71 with wavelength equals to 550 nm), Alq3 (refractive index equals to 1.63 with wavelength equals to 550 nm), or Liq (refractive index equals to 1.65 with wavelength equals to 500 nm). The composite material may adopt a single layer structure formed by conducting a co-vapor deposition process on the organic material with MgF, LiF, or NaF.

In one example, the third light output coupling layer 123 is made of organic material or inorganic material having a refractive index in a range from 1.1 to 1.4. Specifically, the third light output coupling layer 133 may adopt MgF, LiF, NaF, KF, or BaF2.

In one example, the light emitting unit 110 may include a thin film transistor (TFT) substrate 101, a ITO substrate 102, a hole injection layer 103, and a hole transport layer 104, a red-green-blue-yellow (R/G/B/Y) light emitting layer 105, an electron transport layer 106, an electron injection layer 107, and a metal cathode 108 configured on the light emitting unit 110 in sequence.

Wherein the light output coupling unit 120 is configured on the metal cathode 108. The R/G/B/Y light emitting layer 105 may adopt a single layer structure, a double layer structure, or a triple layer structure. The metal cathode 108 may adopt metal materials having low work function, such as, but not limited to, Li, Mg, Ca, Sr, La, Ce, Eu, Yb, Al, Cs, Rb, Ag, or an alloy of the above metal material. The metal cathode 108 may be used alone or may be used in combination.

Figure 4:
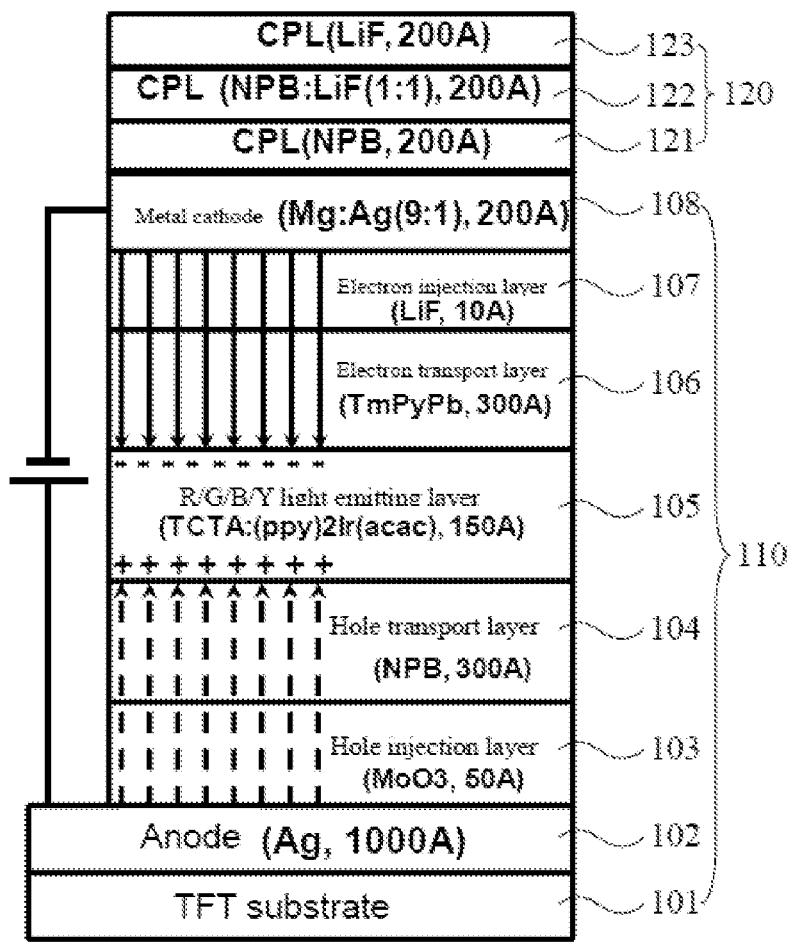
FIG. 4 is a schematic view of a Top-OLED having a multiple layers light output coupling structure in one embodiment of the present disclosure.

In one example, referring to FIG. 4, the ITO anode 102 may adopt Ag with a thickness 1000 A. The hole injection layer 103 may adopt MoO3 with a thickness 50 A. The hole transport layer 104 may adopt NPB with a thickness 300 A. The R/G/B/Y light emitting layer 105 may adopt TCTA: (ppy)2Ir(acac) with a thickness 150 A. The electron transport layer 106 may adopt TmPyPb with a thickness 300 A. The electron injection layer 107 may adopt LiF with a thickness 10 A. The metal cathode 108 may adopt Mg and Ag in a ratio 1:9 with a thickness 200 A. The first light emitting coupling layer 121 may adopt NPB with a thickness 200 A. The second light emitting coupling layer 122 may adopt NPB and LiF in a ratio 1:1 with a thickness 200 A. The third light emitting coupling layer 123 may adopt LiF with a thickness 200 A.

Figure 2:
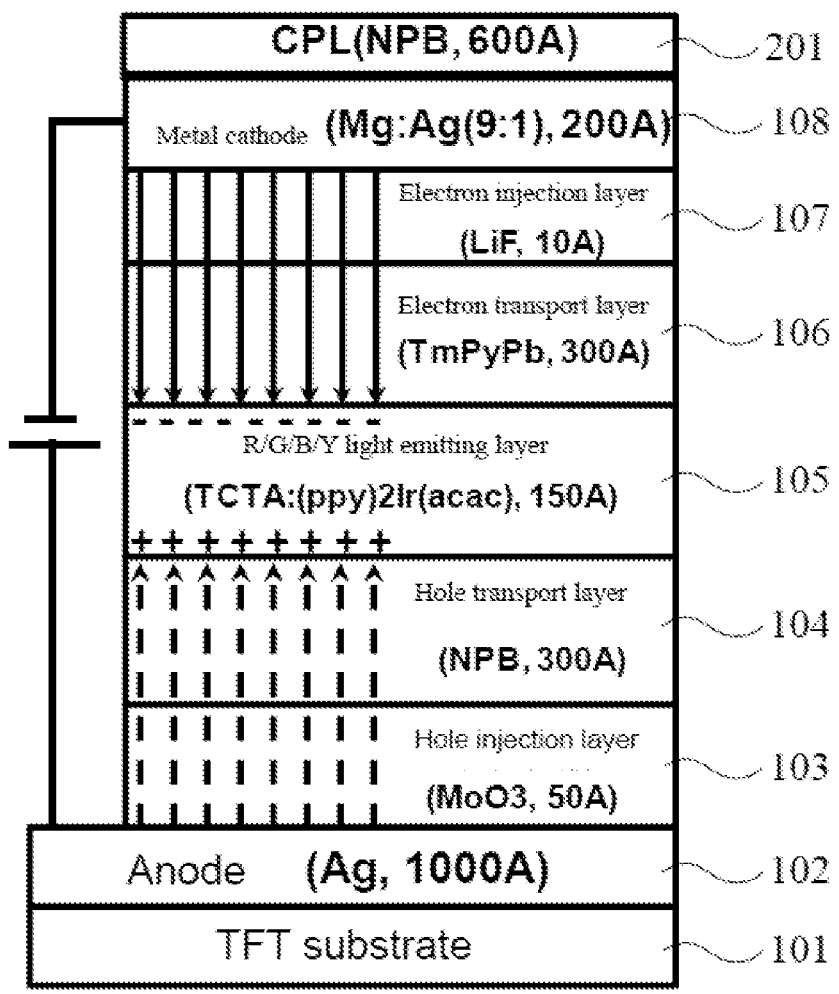
FIG. 2 is a schematic view of a Top-OLED having a single layer light output coupling structure in one embodiment of the present disclosure.
Figure 3:
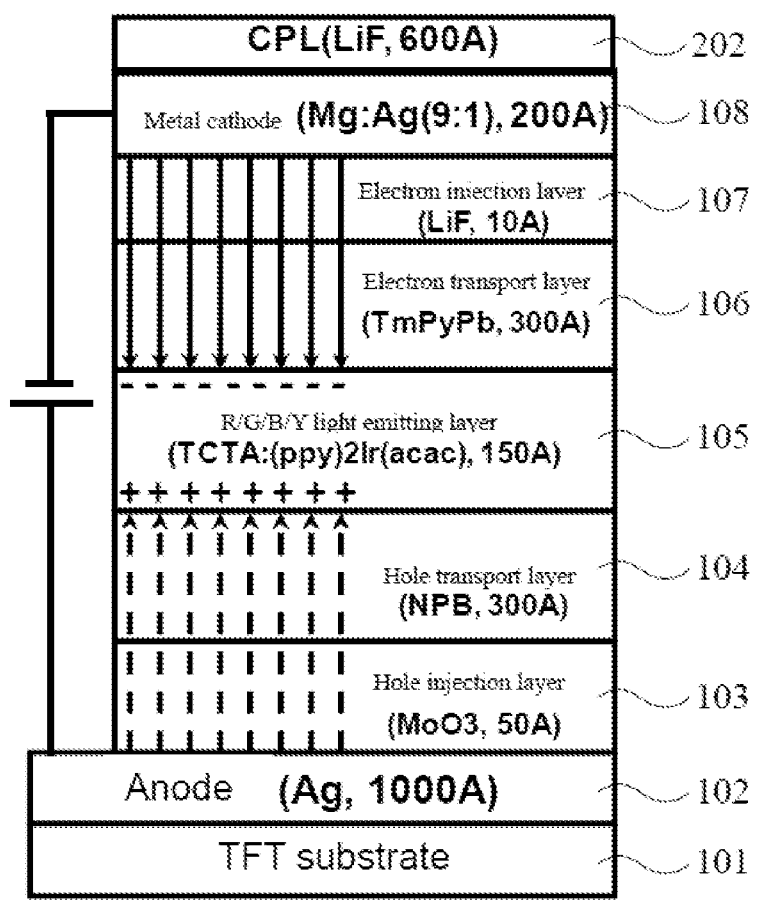
FIG. 3 is a schematic view of a Top-OLED having another single layer light output coupling structure in one embodiment of the present disclosure.

Referring to FIG. 2 and FIG. 3, the light emitting unit 110 is partially the same with the light emitting unit 110 in FIG. 4, the difference resides in that the light emitting unit 110 adopts the single layer structure in FIG. 2 and FIG. 3, the light output coupling layer 201 adopts NPB with a thickness 600 A in FIG. 2, and the light output coupling layer 202 adopts LiF with a thickness 600 A in FIG. 3.

The performance of devices in FIG. 2, FIG. 3, and FIG. 4 is as below.

|  | FIG. 2 | FIG. 3 | FIG. 4 |
|---|---|---|---|
| Maximum current efficiency (cd/A) | 58.9 | 63.9 | 75.4 |
| Maximum lumen efficiency (lm/w) | 37.4 | 41.7 | 48.7 |
| Maximum external quantum efficiency | 16.2 | 17.8 | 20.8 |

The external quantum efficiency of the triple layer structure in FIG. 4 increases by 28.6 percent and 16.8 percent when being compared with the devices in FIG. 2 and FIG. 3 due to the improvement of the coupling output efficiency of the light output coupling layer 120. The refractive index of NPB and LiF are 1.81 and 1.39 respectively with the wavelength equals to 520 nm in the device shown in FIG. 4. A refractive index of a doping layer of NPB and LiF is 1.64 with a wavelength equals to 520 nm. By conducting a doping process, the refractive index of a thin film may be in between the refractive index of NPB and the refractive index of LiF. As shown in FIG. 4, the coupling layer of the device is a combination of NPB with thickness 200 A, LiF and NPB in the ratio 1:1 with the thickness 200 A. and LiF with the thickness 200 A. The refractive index respectively is 1.8, 1.64, and 1.39, which is in a decreasing tendency, with wavelength equals to 520 nm. The decreasing tendency of the refractive index in the coupling layer may improve the coupling output efficiency, and may improve the performance of the device.

Figure 5:
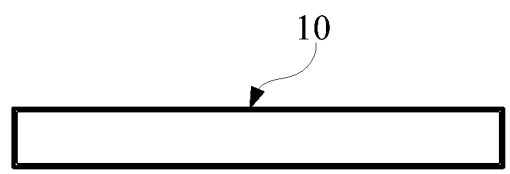
FIG. 5 is a schematic view of a flat panel display device in one embodiment of the present disclosure.

As shown in FIG. 5, the present disclosure further relates to a flat panel display device 10, wherein the flat panel display device 10 includes the Top-OLED 100.

In view of the above, the present disclosure provides the flat panel display device and the Top-OLED, wherein the light emitting coupling layers configured on the light output surface of the light emitting unit having the refractive index being configured to be decreased gradually, so as to enhance the external quantum efficiency and to increase the amount of outputting light beams.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:
1. A top organic light emitting diode (Top-OLED), comprising:
   a light emitting unit;
   a light output coupling unit configured on a light output surface of the light emitting unit, wherein the light output coupling unit is configured with a first light emitting coupling layer and a second first light emitting coupling layer configured on the light output surface of the light emitting unit in sequence, and a refractive index of the first light emitting coupling layer is greater than a refractive index of the second light emitting coupling layer;

the light output coupling unit further comprises a third light emitting coupling layer being stacked on the second first light emitting coupling layer, wherein the refractive index of the second light emitting coupling layer is greater than a refractive index of the third light emitting coupling layer;

wherein the first light emitting coupling layer is a first NPB layer having the refractive index greater than 1.75, the second light emitting coupling layer is a single layer structure having the refractive index in a range from 1.4 to 1.75 and formed by conducting a co-vapor deposition process of NPB and LiF in a ratio 1:1, and the third light emitting coupling layer is a first LiF layer having the refractive index in a range from 1.1 to 1.4.

2. The Top-OLED according to claim 1, wherein the light emitting unit comprises a thin film transistor (TFT) substrate, a ITO substrate, a hole injection layer, and a hole transport layer, a red-green-blue-yellow (R/G/B/Y) light emitting layer, an electron transport layer, an electron injection layer, and a metal cathode configured on the light emitting unit in sequence; wherein the light output coupling unit is configured on the metal cathode.

3. A flat panel display device, comprising a Top-OLED, wherein the Top-OLED comprises:
a light emitting unit;
a light output coupling unit configured on a light output surface of the light emitting unit, wherein the light output coupling unit is configured with a first light emitting coupling layer and a second first light emitting coupling layer configured on the light output surface of the light emitting unit in sequence, and a refractive index of the first light emitting coupling layer is greater than a refractive index of the second light emitting coupling layer;
the light output coupling unit further comprises a third light emitting coupling layer being stacked on the second first light emitting coupling layer, wherein the refractive index of the second light emitting coupling layer is greater than a refractive index of the third light emitting coupling layer;
wherein the first light emitting coupling layer is a first NPB layer having the refractive index greater than 1.75, the second light emitting coupling layer is a single layer structure having the refractive index in a range from 1.4 to 1.75 and formed by conducting a co-vapor deposition process of NPB and LiF in a ratio 1:1, and the third light emitting coupling layer is a first LiF layer having the refractive index in a range from 1.1 to 1.4.

4. The flat panel display device according to claim 3, wherein the light emitting unit comprises a thin film transistor (TFT) substrate, a ITO substrate, a hole injection layer, and a hole transport layer, a red-green-blue-yellow (R/G/B/Y) light emitting layer, an electron transport layer, an electron injection layer, and a metal cathode configured on the emitting unit in sequence;
wherein the light output coupling unit is configured on the metal cathode.

5. The flat panel display device according to claim 4, wherein the ITO substrate comprises a Ag layer with a thickness 1000 A, the hole injection layer is a $MoO_3$ layer with a thickness 50 A, the hole transport layer is a second NPB with a thickness 300 A, the R/G/B/Y light emitting layer is a TCTA: (ppy)2Ir(acac) layer with a thickness 150 A, the electron transport layer is a TmPyPb layer with a thickness 300 A, the electron injection layer is a second LiF layer with a thickness 10 A, the metal cathode is a Mg/Ag layer with Mg and Ag in a ratio 1:9 and having a thickness 200 A, the first light emitting coupling layer has a thickness 200 A, the second light emitting coupling layer has a thickness 200 A, and the third light emitting coupling layer has a thickness 200 A.

6. The flat panel display device according to claim 5, wherein the maximum current efficiency of the Top-OLED is 75.4, the maximum lumen efficiency of the Top-OLED is 48.7, and the maximum external quantum efficiency of the Top-OLED is 20.8.

7. The Top-OLED according to claim 2, wherein the ITO substrate comprises a Ag layer with a thickness 1000 A, the hole injection layer is a $MoO_3$ layer with a thickness 50 A, the hole transport layer is a second NPB with a thickness 300 A, the R/G/B/Y light emitting layer is a TCTA: (ppy)2Ir (acac) layer with a thickness 150 A, the electron transport layer is a TmPyPb layer with a thickness 300 A, the electron injection layer is a second LiF layer with a thickness 10 A, the metal cathode is a Mg/Ag layer with Mg and Ag in a ratio 1:9 and having a thickness 200 A, the first light emitting coupling layer has a thickness 200 A, the second light emitting coupling layer has a thickness 200 A, and the third light emitting coupling layer has a thickness 200 A.

8. The Top-OLED according to claim 7, wherein the maximum current efficiency of the Top-OLED is 75.4, the maximum lumen efficiency of the Top-OLED is 48.7, and the maximum external quantum efficiency of the Top-OLED is 20.8.

* * * * *